United States Patent [19]
Arami et al.

[11] Patent Number: 5,275,683
[45] Date of Patent: Jan. 4, 1994

[54] MOUNT FOR SUPPORTING SUBSTRATES AND PLASMA PROCESSING APPARATUS USING THE SAME

[75] Inventors: Junichi Arami, Tokyo; Kazuo Fukasawa, Kofu; Takashi Ito, Tokyo, all of Japan

[73] Assignees: Tokyo Electron Limited, Tokyo; Tokyo Electron Yamanashi Limited, Nirasaki, both of Japan

[21] Appl. No.: 965,851

[22] Filed: Oct. 23, 1992

[30] Foreign Application Priority Data

Oct. 24, 1991 [JP] Japan ..................... 3-305345
Oct. 24, 1991 [JP] Japan ..................... 3-305346

[51] Int. Cl.$^5$ ................ H01L 21/306; B44C 1/22
[52] U.S. Cl. ................ 156/345; 156/643
[58] Field of Search .............. 156/643, 646, 345; 204/192.32, 298.34, 298.38; 219/121.36, 121.4, 121.41, 121.52, 121.53

[56] References Cited

U.S. PATENT DOCUMENTS

5,078,851  1/1992  Nishihata et al. ............. 204/298.34
5,147,497  9/1992  Nozawa et al. ............... 156/345 X

*Primary Examiner*—William A. Powell
*Attorney, Agent, or Firm*—Oblon, Spivak, McClelland, Maier & Neustadt

[57] ABSTRACT

A wafer mount is arranged in a process chamber of the plasma etching apparatus. The rim section of a susceptor which serves as a mount body is curved at a large curvature radius. An electrostatic chuck sheet is arranged on the top of the susceptor and its rim is curved downward along the curved rim section of the susceptor, departing from the marginal portion of a semiconductor wafer mounted thereon as it comes outward. The rim of the electrostatic chuck sheet can be thus shortened in the horizontal direction and this enables a conductive film in the electrostatic chuck sheet to be made longer in the same direction. The electrostatic and thermal connection of the wafer to the electrostatic chuck sheet can be thus enhanced.

14 Claims, 6 Drawing Sheets

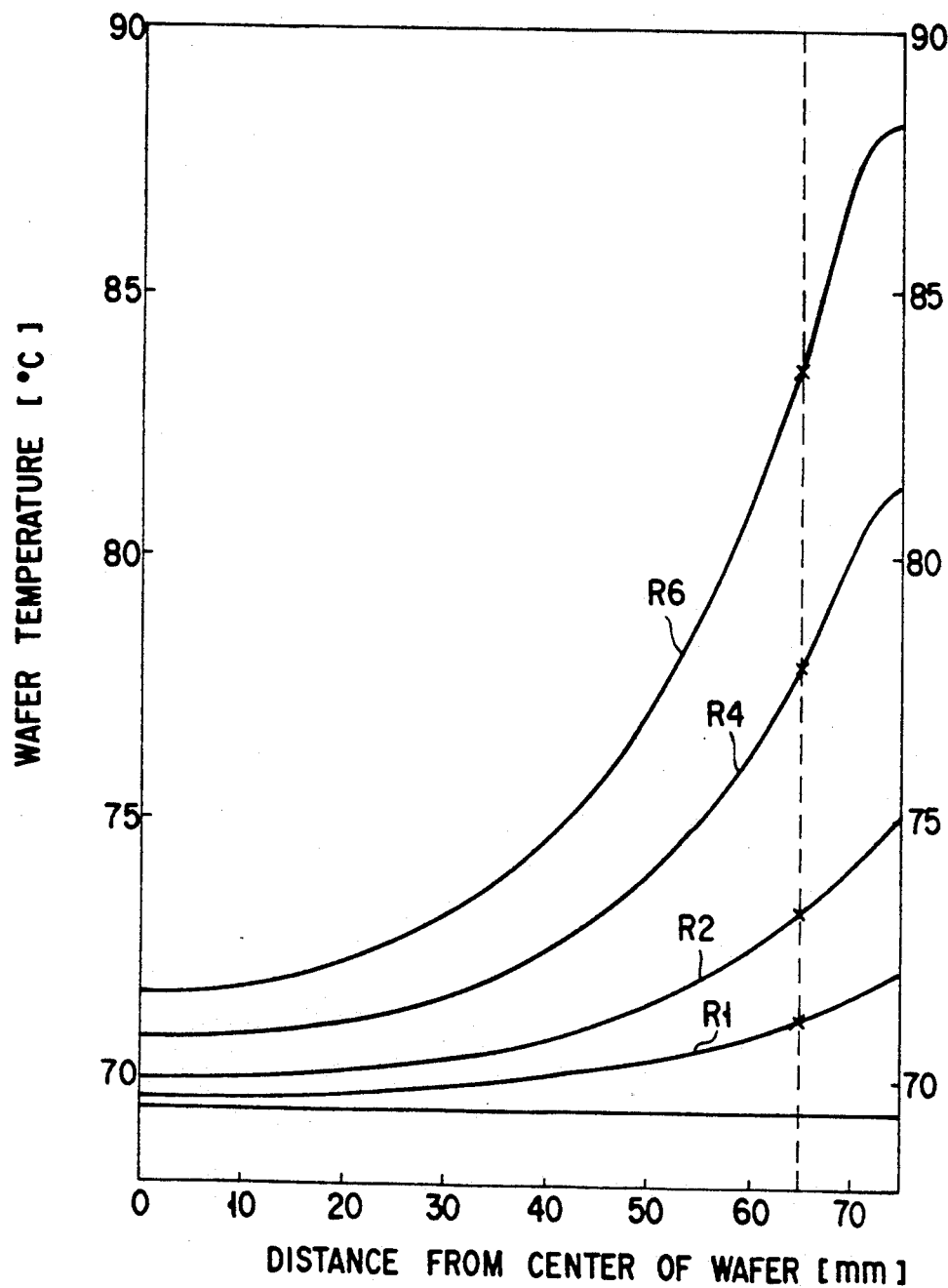
F I G. 3

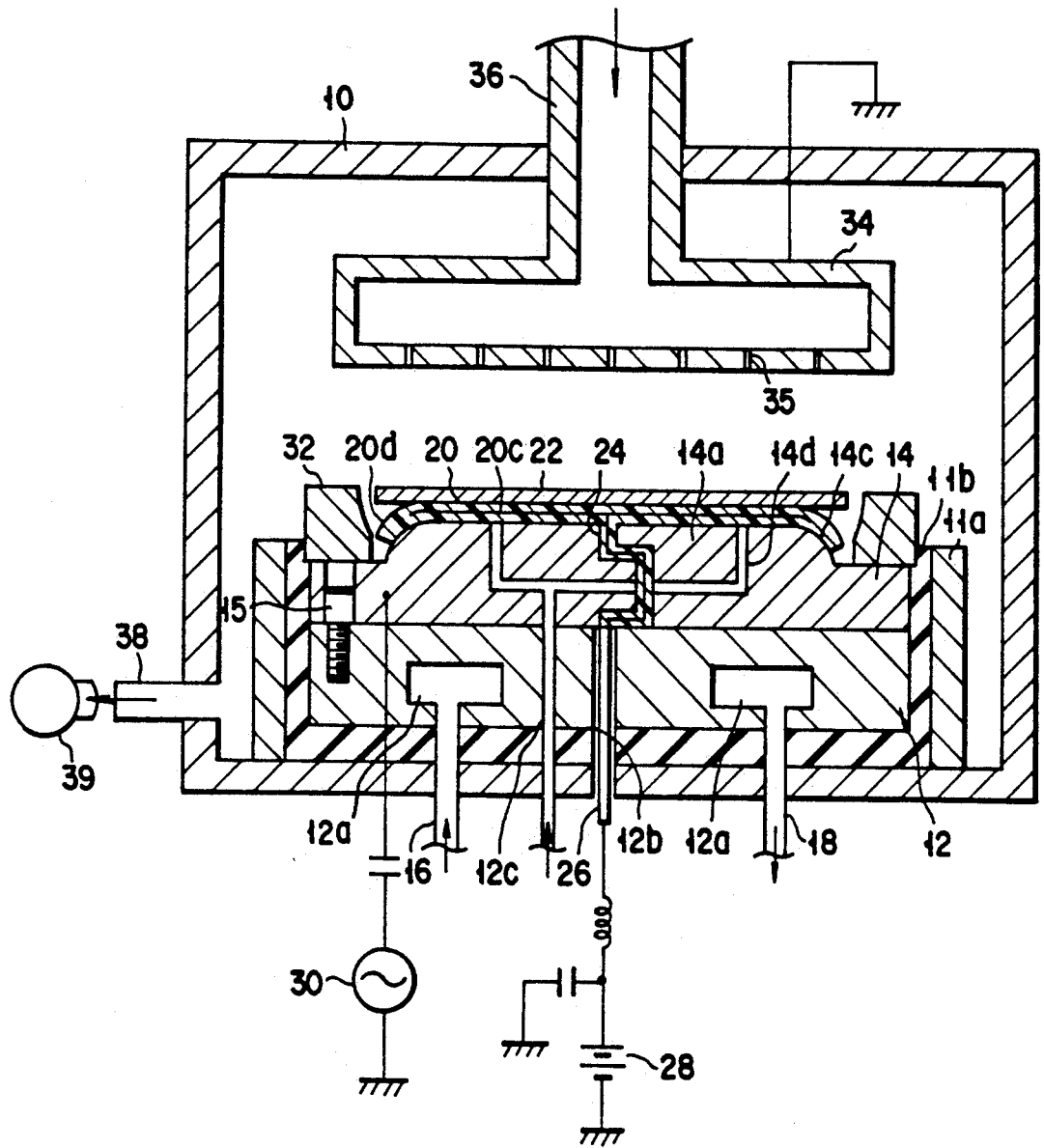
F I G. 4

MOUNT FOR SUPPORTING SUBSTRATES AND PLASMA PROCESSING APPARATUS USING THE SAME

BACKGROUND OF THE INVENTION

1. Field of the Invention

The present invention relates to a mount on which substrate to be treated is mounted, and a plasma processing apparatus in which the mount is used. More particularly, it relates to an improvement of the mount on which a semiconductor wafer is mounted.

2. Description of the Related Art

In the case of the semiconductor processing apparatus, a sheet of the semiconductor wafer is mounted on a conductive mount, which is called susceptor, in a vacuum reactor chamber and a certain process is applied to the surface of the wafer. Recently, those of the electrostatic chuck type are being used as the conductive mount or susceptor. According to these mount, the wafer is attracted and held on the susceptor by electrostatic power without using any mechanical holder means such as the cramp.

In the case of the initial electrostatic chucks of this type, the surface of the susceptor is oxidized to form an insulating film on it. High voltage is applied to the susceptor and the insulating film on the susceptor surface is polarized. Static electricity is thus caused on this susceptor surface and the wafer is attracted and held on the susceptor by the coulomb force of this static electricity. In the case of these susceptors of the electrostatic chuck type, however, the insulating film on the susceptor surface is not fully polarized and electrostatic attraction force thus created is not enough to hold the wafer on the susceptor. In order to overcome this, a susceptor which is covered by an electrostatic chuck film is now mainly being used.

FIG. 1 shows this wafer mount which is used in the plasma etching apparatus of the type processing wafers one by one and which is of the electrostatic chuck type. A focus ring 102 is arranged around a susceptor 100 to apply uniform process to the face of a semiconductor wafer 102 and an electrostatic chuck sheet 106 is arranged on the top of the susceptor 100.

The electrostatic chuck sheet 106 comprises a pair of polyimide resin films 108 and 110 and a thin conductive film 112 such as a copper foil sealed between the polyimide resin films. The sheet 106 is formed as a flat disk to match the top (or wafer-supporting face) of the susceptor 100. It is provided with a plurality of through-holes (which correspond to holes identified by reference numeral 20e in FIG. 5) and inactive gas such as He is supplied from the susceptor 100 to and between the wafer 102 and the sheet 106 through the holes to improve thermal conductibility between them.

The conductive film 112 of the sheet 106 has a diameter smaller than those of the polyimide resin films 108 and 110 which are bonded to each other at a rim section 106a of the sheet 106. In other words, this rim section 106a corresponds to a overlap width of the resin films 108 and 110. The rim section 106a inevitably results from the structure of the electro-static chuck sheet in which the conductive film is sealed between the two resin films. However, the insulating function of preventing the conductive film 112 from being exposed and shortened with external components (particularly with the susceptor) can be achieved by the rim section 106a.

Diameters of the top of the susceptor 100 and the sheet 106 are set smaller than that of the wafer 102, as shown in FIG. 1. This is intended to allow reactive ions to enter not into the wafer-supporting surface of the susceptor but only into the surface of the wafer 102. When reactive ions in plasma enter into the wafer-supporting surface of the susceptor 100 in the case of the plasma etching process, for example, that portion of the wafer-supporting surface into which reactive ions have entered is etched. This is not preferable.

In the case of the mount having the above-described arrangement, however, the following problems are caused.

The diameter of the wafer-supporting surface of the susceptor 100 is made smaller than that of the wafer 102. Therefore, the marginal portion of the wafer 102 is a little projected outside from the brink of the susceptor 100 only by a distance (ra). In addition to this portion (ra), that portion of the wafer 102 which is contacted with the rim 106a of the sheet 106 is also projected from the end portion of the conductive film 112 in the sheet 106 by a distance (rb). Therefore, attraction force applied from the conductive film 112 in the sheet 106 to the wafer 102 is reduced at that marginal portion of the wafer 102 which extends over a distance (R) represented by the sum of distances (ra) and (rb). Thermal conductibility between the sheet 106 and the marginal portion of the wafer 102 is thus lowered to thereby reduce the capacity of uniformly heating the wafer 102. However, the rim or margin 106a of the sheet 106 is inevitably and technically needed from the viewpoint of the sheet making and the shortening stop. The sheet 106 therefore has a limit in that its rim or margin 106a is made smaller.

The focus ring 104 encloses the susceptor with a clearance 114 of 0.1–0.3 mm interposed between them so as to protect the susceptor 100 from plasma. When voltage applied to the susceptor 100 or the concentration of plasma is quite high, however, discharge is caused from the susceptor brink or corner 116 to thereby damage or break the susceptor 100 and the electrostatic chuck sheet 106.

SUMMARY OF THE INVENTION

An object of the present invention is therefore to provide a mount capable of increasing the attracting and holding force applied to the substrate and the capacity of equally heating the substrate, and also to provide a plasma processing apparatus in which this mount is used.

Another object of the present invention is to provide a mount capable of preventing discharge from being caused from the mount and a plasma processing apparatus in which this mount is used.

According to the present invention, there can be provided an apparatus for plasma-processing wafer-like substrates comprising: a process chamber; exhaust pump means for setting the chamber highly depressurized; means for supplying process gas, which is made into plasma, into the chamber; means for making the process gas into plasma., a mount body for supporting the substrate during the plasma process, the mount body being made convex and including a supporting surface opposed to the substrate and a side formed continuous from the supporting surface at an angle; and an electrostatic chuck sheet interposed between the mount body and the substrate and serving to attract and hold the substrate by electrostatic power, the sheet covering the supporting surface of the mount body while extending its rim along the side of the mount body.

According to a preferred aspect of the present invention, the electrostatic chuck sheet comprises a conductive film and two insulating resin films, larger in dimension than the conductive film, and sandwiching the conductive film between them. Those portions of the resin films which are projected outside from the end portion of the conductive film are bonded to each other to form the rim.

According to the present invention, the rim of the electrostatic chuck sheet is bent or curved, departing from the marginal portion of the wafer as it comes outward, so as to cover the bent or curved side or rim section of the mount body or susceptor. The length of the rim of the electrostatic chuck sheet in the radial direction thereof can be made smaller, thereby enabling the end portion of the conductive film in the electrostatic chuck sheet to be made nearer to the marginal portion of the substrate or wafer. Electrostatic attraction force applied from the electrostatic chuck sheet to the substrate can be thus increased to thereby make temperature difference smaller between the marginal portion of the substrate and the center thereof.

When the rim section of the supporting surface of the susceptor is curved and the rim of the electrostatic chuck sheet is also curved to cover the curved rim section of the susceptor, the concentrating of electric field on the rim section of the susceptor can be prevented, so that the breaking of the susceptor can be stopped and that the burning and insulation damaging of the sheet can be prevented.

The temperature distribution of the wafer was calculated, using a simulation model shown in FIG. 2, to check what temperature the wafer has when the marginal portion of the wafer is projected outside from the end portion of the conductive film in the electrostatic chuck sheet by what distance. This calculation was carried out under the following conditions.

The diameter of wafer 2 : 150 mm,
the thermal conductivity of wafer 2 : 150 W/mK,
RF power applied to wafer 2 : 200W,
the length of the margin rim portion of electrostatic chuck sheet 4 : 1.5 mm.
the surface temperature of sheet 4 : 25° C. all over it,
gas supplied to and between wafer 2 and sheet 4 : He and P=7.5 Torr, and
thermal conductance between wafer 2 and sheet 4 : $34 \times P$ W/m$^2$K (empirical formula), i.e. $34 \times 7.5 = 255$ W/m$^2$K.

The temperature distribution of the wafer 2 was calculated under the above conditions and taking the distance R of the wafer 2 projected as being 6, 4, 2 and 1 mm. Curves represented by $R_6$, $R_4$ $R_2$ and $R_1$ in FIG. 3 were obtained. Radiation and thermal transmission applied outside from the wafer 2 were neglected upon conducting the calculation.

As shown in FIG. 3, it can be understood that the surface temperature uniformity of the wafer is further lowered as the distance R of the wafer projected becomes larger When the distance R was 6, 4, 2 and 1 mm, temperature difference $\Delta T$ between the center of the wafer and an area thereof separated from the edge thereof by 10 mm became 11.9° C., 7.1° C., 3.2° C. and 1.6° C., respectively.

According to the present invention, the distance of the wafer projected outside from the end portion of the conductive film in the electrostatic chuck sheet can be made smaller. This enables the surface temperature uniformity of the wafer to be increased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is the graph showing what temperature distribution a wafer has when it is projected from the end portion of a conductive film of an electrostatic chuck sheet, by what distance;

FIG. 4 is a sectional view showing the whole of the plasma etching apparatus according to an embodiment of the present invention;

DETAILED DESCRIPTION OF THE PREFERRED EMBODIMENTS

Figure 1:
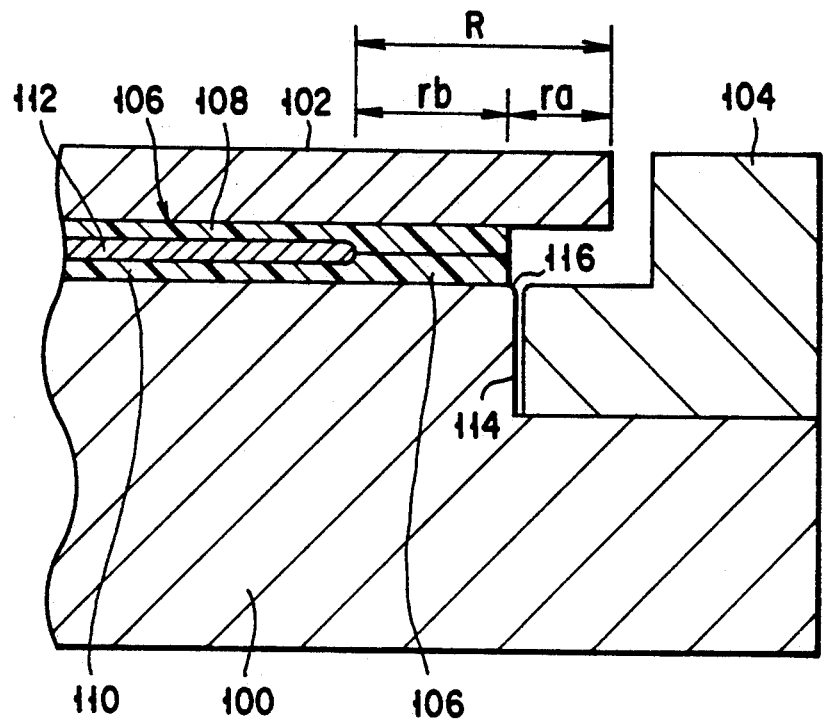
FIG. 1 is a sectional view showing part of a conventional wafer mount.
Figure 2:
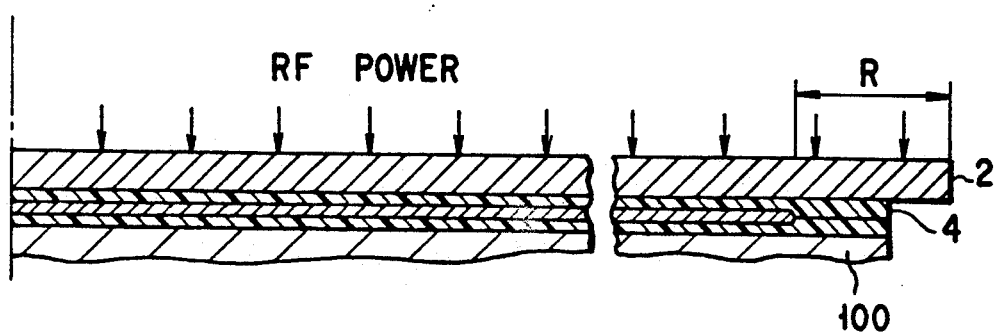
FIG. 2 is a sectional view showing a part of a simulation model used to obtain a graph in FIG. 3.

In the case of a plasma etching apparatus shown in FIG. 4, an outer conductive cylindrical support frame $11a$ is formed on the bottom of a process chamber 10 at the center thereof and at is made integral to the process chamber 10. An inner insulating cylindrical support frame $11b$ is fitted into the outer one $11a$. A cylindrical susceptor support 12 is arranged in the inner support frame $11b$ and a susceptor 14 is attached to the top of the susceptor support 12 by means of bolts 15. Both of the susceptor 14 and the susceptor support 12 are made of conductive metal such as aluminium. A cooling jacket $12a$ is formed in the susceptor support 12 and cooling liquid introduced into the cooling jacket $12a$ through a pipe 16 is exhausted outside the apparatus through a pipe 18.

Figure 5:
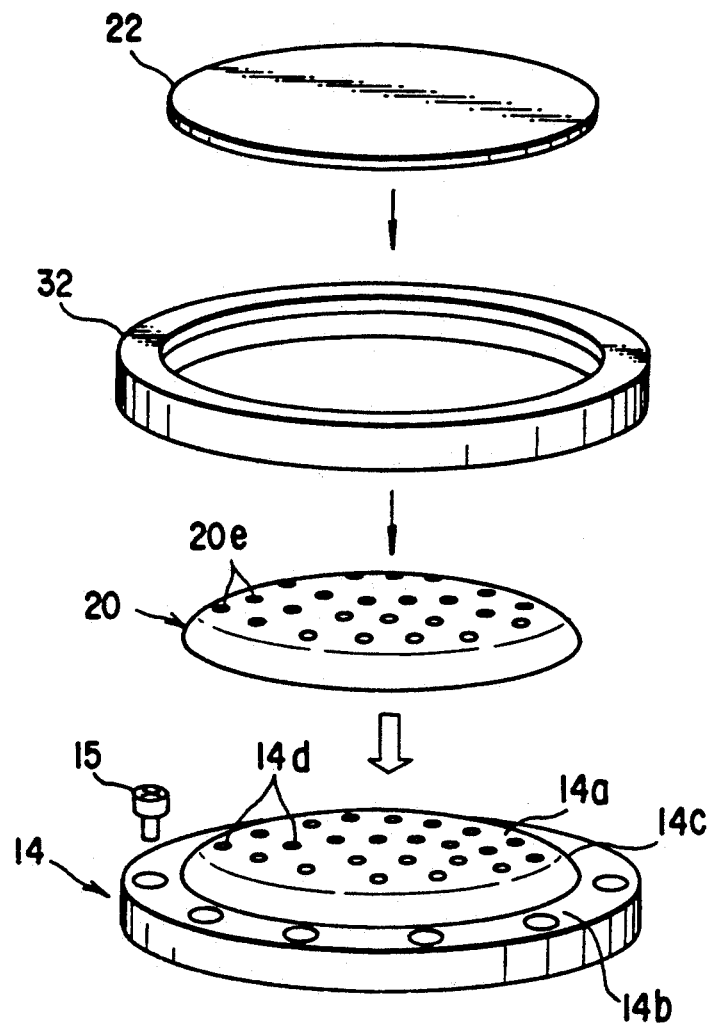
FIG. 5 is a perspective view showing a wafer mount, which is used in the apparatus in FIG. 3, dismantled.

As shown in FIG. 5, the susceptor 14 is shaped like a disk including a thick wafer-supporting section $14a$ and a thin collar or flange section $14b$, these sections $14a$ and $14b$ being formed integral to each other. An outer rim section $14c$ of the wafer-supporting section or surface $14a$ is curved at a large curvature radius. Through-holes $12c$ and $14d$, through which a heat-exchange gas for cooling, such as Ar, He, or $O_2$, is supplied to the underside of a semiconductor wafer 22, are formed in the susceptor support 12 and the susceptor 14, respectively.

Figure 6:
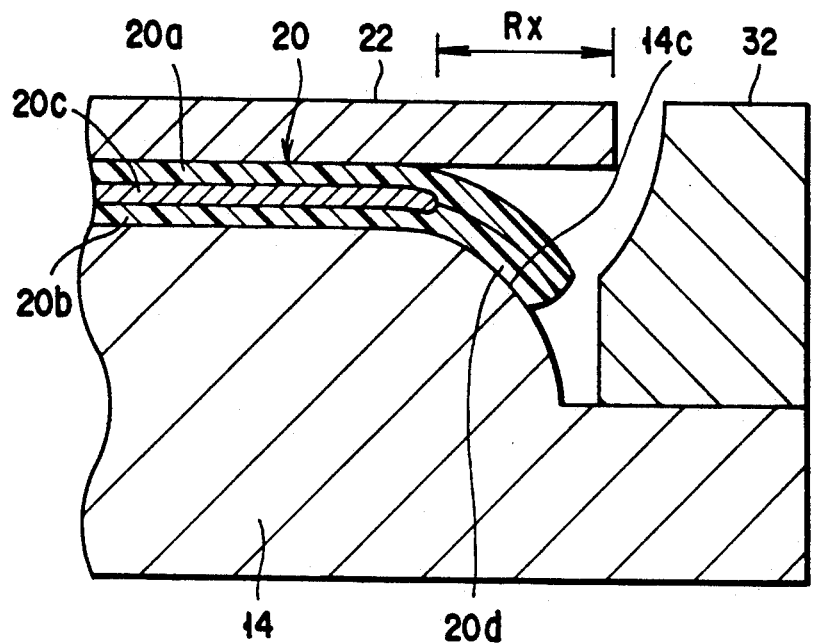
FIG. 6 is a sectional view showing the wafer mount enlarged.

An electrostatic chuck sheet 20 is seated on the wafer-supporting surface of the susceptor 12 and the wafer 22 is mounted on the electrostatic chuck sheet 20. The supporting surface of the susceptor 14 and the sheet 20 are set to have virtual diameters or diameters in the plan view smaller than that of the wafer 22. As shown in FIG. 6, the sheet 20 is formed by sealing a conductive film 20c such as copper foil between two sheets of insulating films 20a and 20b each made of high molecular resin. The sheet 20 includes a rim portion 20d curved along the outer circumferential rim section 14c of the wafer-supporting surface of the susceptor 14. It also includes through-holes 20e, as shown in FIG. 5, through which the heat-exchange gas such as Ar or He is supplied to the underside of the wafer 22.

As shown in FIG. 4, the conductive film 20c of the electrostatic chuck sheet 20 is connected to a DC power source 28 through a conductive line covered by an insulating cable 24 in the susceptor 14 and a current supply rod 26 passed through a through-hole 12b in the susceptor support 12. A high frequency power source 30 is connected to the susceptor support 12.

A focus ring 32 is arranged on the flange section 146 of the susceptor 14, enclosing the wafer 22. It is made of insulating or conductive material such as SiC or C and used to uniformly treat the wafer 22. Its top is on substantially the same level as that of the wafer 22.

An upper electrode 34 is located above the susceptor 14. Plasma or etching gas such as $CF_4$ is supplied to the upper electrode 34 through a gas supply pipe 36. The etching gas is blown downward through a plurality of small holes 35 in an electrode face of the upper electrode 34.

The upper electrode 34 is earthed and high frequency current of 389 kHz and 1.5 kW, for example, is applied from the high frequency power source 30 to and between the upper electrode 34 and the susceptor (or lower electrode) 14. Plasma is thus generated under the upper electrode 34 and reactive ions created by this plasma enter into the wafer 22 in a direction perpendicular to the surface thereof to react with the surface matter of the wafer 22. The wafer 22 is thus etched. Reaction products caused by this etching of the wafer 22 are exhausted outside the apparatus through an exhaust pipe 38, which is connected to the side wall of the process chamber 10 at the lower end thereof, by an exhaust pump 39. The process chamber 10 is so highly reduced in pressure by the pump 39 as to allow the teaching of wafer to be achieved.

High DC voltage of 2.0 kV, for example, is applied from the DC power source 28 to the conductive film 20c of the electrostatic chuck sheet 20. Static electricity as thus generated on the surface of the sheet 20 by polarization and the wafer 22 is attracted onto the sheet 20 by coulomb force of this static electricity.

As shown in FIG. 6, the marginal rim 20d of the electrostatic chuck sheet 20 is formed along the curved circumferential rim section 14c of the susceptor 14. In other words, the rim 20d of the sheet 20 is curved downward, gradually departing from the wafer 22 as it comes outward. Even though the length of the rim 20d itself is the same as that of the conventional one, therefore, its length in the horizontal direction becomes smaller. This enables the conductive film 20c in the sheet 20 to come nearer to the marginal portion of the wafer 22 by such an extent that corresponds to the shortened length of the rim 20d in the horizontal direction.

The distance Rx of that marginal potion of the wafer 22 which is projected from the end portion of the conductive film 20c in the electrostatic chuck sheet 20 is therefore smaller than that R of the water when the conventional electrostatic chuck shown in FIG. 1 is used. The electrostatic and thermal connection of the wafer 22 to the conductive film 20c in the electrostatic chuck sheet 20 is thus enhanced and the force with which the marginal portion of the wafer 22 is electrostatically attracted is increased. In addition, temperature difference between the marginal portion of the wafer 22 and the center thereof is made small, as already described referring to the graph in FIG. 3.

In general, the high frequency power is quite high, say, 380 kHz and 1.5 kW, for example, or the concentration of plasma is quite high in plasma etching apparatuses. In the case of the conventional structure shown in FIG. 1, electric field will be concentrated on and discharge will be caused at the corner 116 of the wafer-supporting surface of the susceptor 100. It is therefore feared that the susceptor 100 will be broken or damaged. In contrast, when the rim section 14c of the wafer-supporting surface of the susceptor 14 is curved at a large curvature radius as shown in FIG. 6, there is no fear that electric field will be concentrated on this rim section 14c. In the case of the conventional structure shown in FIG. 1, the corner of the wafer-supporting surface of the susceptor is formed like a substantially right angle, having a curvature radius of 0.8 mm, at most. The rim section 14c of the wafer-supporting surface of the susceptor 14 and the rim 20d of the electrostatic chuck sheet 20 are curved at a curvature radius of 3.0 mm.

In addition, the rim 20d of the electro-static chuck sheet 20 is curved, covering the same curved rim section 14c of the susceptor 14. The concentration of electric field on the susceptor rim portion can be more effectively prevented by the dielectric strength of the rim 20d. When the films 20a and 20b of the sheet 20 are made of not-crystallized aramid resin, having a thickness of 50 μm, for example, an dielectric strength of about 2.3 kV can be obtained because the dielectric breakdown voltage of this resin is 230 kV/mm.

Figure 7:
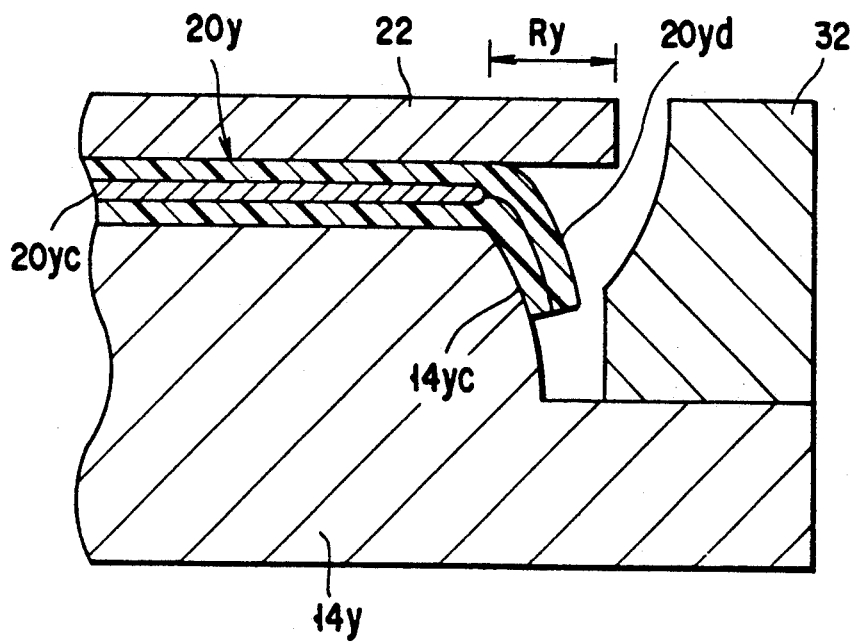
FIG. 7 is a sectional view showing a variation of the wafer mount enlarged.

FIG. 7 shows a variation of the wafer mount according to the present invention. In the case of this variation, the rim section 14yc of the wafer supporting surface of a susceptor 14y is shaped close to an angle and a rim 20yd of an electrostatic chuck sheet 20y is bent on and along the rim section or side 14yc of the susceptor 14y. When arranged in this manner, the rim 20yd or the electrostatic chuck sheet 20y extends downward substantially in the vertical direction and its length Ry in the horizontal direction can be made shortened to a greater extent. The radius of a conductive film 20yc in the electrostatic chuck sheet 20y can be thus made larger and the electrostatic and thermal connection of the wafer 22 to the conductive film 20yc can be further enhanced.

It may be arranged that the rim portion of the wafer-supporting surface of the susceptor is tilted at an angle of 120°, for example, without bending it substantially at right angle as seen in the above-described variation and that the rim of the electrostatic chuck sheet is formed on and along the titled rim section of the susceptor.

When the conductive film in the electrostatic chuck sheet is extended to the curved rim section of the susceptor, its electrostatic and thermal connection to the wafer can be still further enhanced.

The electrostatic chuck sheet 20 is curved or bent to form the three-dimensional rim 20d, as described above. Therefore, the not-crystallized aramid resin or polyimide resin is most suitable for the high molecular films 20a and 20b. The aramid resin prior to crystallization is film of swelled gel which has not been subjected to dry and thermal treatment. Its polymer is not crystallized and its deep-drawing molding can be made. When the electrostatic chuck sheet is made of this resin, therefore, its rim can be curved at any optional curvature radius or bent at any optional angle.

Figure 8:
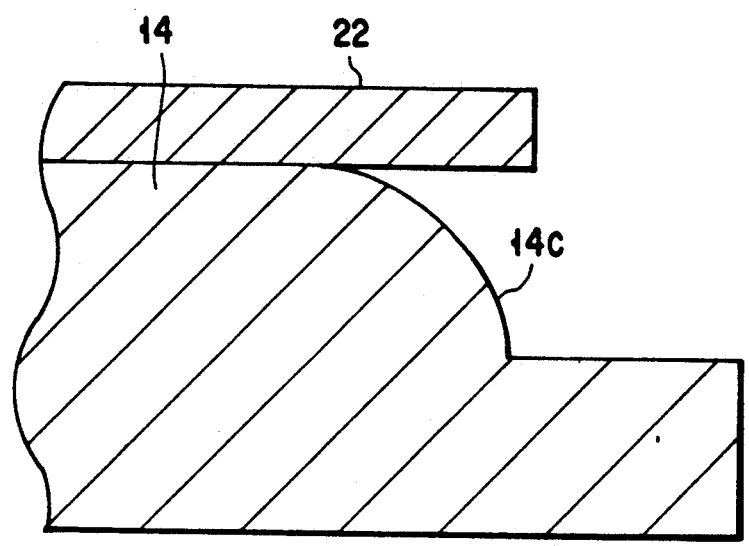
FIG. 8 is a sectional view showing another variation of the wafer mount enlarged.

FIG. 8 shows another variation of the wafer-mount. Even when no electrostatic chuck sheet is used and the wafer 22 is directly mounted on the top of the susceptor 14 as shown in FIG. 8, it is advantageous for the rim section 14c of the wafer-supporting surface of the susceptor 14 to be curved. When so arranged, electric field can be stopped from concentrating on the rim section 14c and the breaking or damaging of the susceptor 14 can be thus prevented.

Although the present invention has been described citing the plasma etching apparatus, the wafer mount of the present invention can be applied to other processing apparatuses such as the ashing and CVD ones.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A mount on which a substrate to be processed is mounted when it is to be processed in a process chamber, comprising:
   a mount body shaped convex and including a supporting surface opposed to the substrate, and a side formed continuous from the supporting surface at an angle; and
   an electrostatic chuck sheet interposed between the mount body and the substrate and serving to attract and hold the substrate by electrostatic power, said sheet covering the supporting surface of the mount body while extending its rim along the side of the mount body.

2. The mount according to claim 1, wherein the side of said mount body is formed continuous from the supporting surface of the mount body with a curved surface interposed therebetween.

3. The mount according to claim 1, wherein said electrostatic chuck sheet includes a conductive film and two insulating resin films, larger in dimension than the conductive film, and sandwiching the conductive film between them, and wherein those portions of the resin films which are extended further from the end portion of the conductive film are bonded to each other to form the rim of said sheet.

4. The mount according to claim 3, wherein said resin films are made of not-crystallized aramid resin or polyimide resin.

5. The mount according to claim 1, wherein a focus ring is arranged around the mount body and the electrostatic chuck sheet, and the top of said ring is substantially the same in level as that of the substrate mounted on the sheet.

6. An apparatus for plasma-processing substrates comprising:
   a process chamber;
   exhaust pump means for setting the chamber highly depressurized;
   means for supplying process gas which is to be made into plasma, into the chamber;
   means for making the process gas into plasma;
   a mount body for supporting the substrate during the plasma process, said mount body being made convex and including a supporting surface opposed to the substrate and a side formed continuous from the supporting surface at an angle; and
   an electrostatic chuck sheet interposed between the mount body and the substrate and serving to attract and hold the substrate by electrostatic power, said sheet covering the supporting surface of the mount body while extending its rim along the side of the mount body.

7. The apparatus according to claim 6, wherein the side of said mount body is formed continuous from the supporting surface of the mount body with a curved surface interposed therebetween.

8. The apparatus according to claim 6, wherein said electrostatic chuck sheet includes a conductive film and two insulating resin films, larger in dimension than the conductive film, and sandwiching the conductive film between them, and wherein those portions of said resin films which are extended further from the end portion of the conductive film are bonded to each other to form the rim of the sheet.

9. The apparatus according to claim 8, wherein said resin films are made of not-crystallized aramid resin or polyimide resin.

10. The apparatus according to claim 6, wherein a focus ring is arranged around the mount body and the electrostatic chuck sheet, and the top of this focus ring is substantially the same in level as that of the substrate mounted on the sheet.

11. An apparatus for plasma-processing of substrates comprising:
    a process chamber;
    exhaust pump means for setting the chamber highly depressurized;
    means for supplying process gas, which is made into plasma, into the chamber;
    means for making the process gas into plasma;
    a mount for supporting the substrate during the plasma process, said mount being formed convex and including a supporting surface opposed to the substrate and a side continuous from the supporting surface at an angle with a curved surface interposed therebetween; and
    a focus ring arranged around the mount and having a top substantially the same in level as that of the substrate mounted on the mount.

12. The apparatus according to claim 11, wherein said mount comprises a mount body shaped convex and having a supporting surface opposed to the substrate and a side continuous from the supporting surface at an angle with a curved surface interposed therebetween, and an electrostatic chuck sheet interposed between the mount body and the substrate and serving to attract and hold the substrate by electrostatic power, said sheet covering the supporting surface of the mount body while extending its rim along the side of the mount body.

13. The apparatus according to claim 12, wherein said electrostatic chuck sheet includes a conductive film and two insulating resin films, larger in dimension than the conductive film, and sandwiching the conductive film between them, and wherein those portions of said resin films which are extended further from the end portion of the conductive film are bonded to each other to form the rim of the sheet.

14. The apparatus according to claim 13, wherein said resin films are made of not-crystallized aramid resin or polyimide resin.

* * * * *